(12) United States Patent
Yamada et al.

(10) Patent No.: US 9,276,105 B2
(45) Date of Patent: Mar. 1, 2016

(54) SILICON CARBIDE SEMICONDUCTOR DEVICE

(71) Applicant: Sumitomo Electric Industries, Ltd., Osaka-shi (JP)

(72) Inventors: Shunsuke Yamada, Osaka (JP); Toru Hiyoshi, Osaka (JP); Takeyoshi Masuda, Osaka (JP); Keiji Wada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/430,141

(22) PCT Filed: Sep. 4, 2013

(86) PCT No.: PCT/JP2013/073783
§ 371 (c)(1),
(2) Date: Mar. 20, 2015

(87) PCT Pub. No.: WO2014/065015
PCT Pub. Date: May 1, 2014

(65) Prior Publication Data
US 2015/0214353 A1 Jul. 30, 2015

(30) Foreign Application Priority Data
Oct. 22, 2012 (JP) .................................. 2012-232604

(51) Int. Cl.
*H01L 29/78* (2006.01)
*H01L 29/66* (2006.01)
(Continued)

(52) U.S. Cl.
CPC ........ *H01L 29/7811* (2013.01); *H01L 29/0615* (2013.01); *H01L 29/0619* (2013.01); *H01L 29/0696* (2013.01); *H01L 29/1608* (2013.01);
(Continued)

(58) Field of Classification Search
CPC ................. H01L 29/0619; H01L 29/66712; H01L 29/7802; H01L 29/7811
See application file for complete search history.

(56) References Cited

U.S. PATENT DOCUMENTS

2007/0272979 A1 11/2007 Saito et al.
2012/0097980 A1 4/2012 Masuda et al.

FOREIGN PATENT DOCUMENTS

JP  2008-004643 A  1/2008
JP  2011-171374 A  9/2011

OTHER PUBLICATIONS

International Search Report issued in PCT International Application No. PCT/JP2013/073783 dated Dec. 10, 2013.

*Primary Examiner* — Bryan Junge
(74) *Attorney, Agent, or Firm* — Venable LLP; Michael A. Sartori

(57) ABSTRACT

A silicon carbide semiconductor device includes an element region and a guard ring region. A semiconductor element is provided in the element region. The guard ring region surrounds the element region in a plan view and has a first conductivity type. The semiconductor element includes a drift region having a second conductivity type different from the first conductivity type. The guard ring region includes a linear region and a curvature region continuously connected to the linear region. A value obtained by dividing a radius of curvature of an inner circumference portion of the curvature region by a thickness of the drift region is not less than 5 and not more than 10. Accordingly, there can be provided a silicon carbide semiconductor device capable of improving a breakdown voltage while suppressing decrease of on-state current.

8 Claims, 10 Drawing Sheets

(51) Int. Cl.
*H01L 29/06* (2006.01)
*H01L 29/16* (2006.01)

(52) U.S. Cl.
CPC ...... *H01L 29/66068* (2013.01); *H01L 29/7802* (2013.01); *H01L 29/0638* (2013.01)

SILICON CARBIDE SEMICONDUCTOR DEVICE

TECHNICAL FIELD

The present invention relates to a silicon carbide semiconductor device, more particularly, a silicon carbide semiconductor device having a guard ring region.

BACKGROUND ART

A guard ring region may be formed in a semiconductor device such as a MOSFET (Metal Oxide Semiconductor Field Effect Transistor) to surround a region at which a semiconductor element is provided in order to suppress a semiconductor element from being broken by concentration of an electric field.

For example, Japanese Patent Laying-Open No. 2008-4643 (Patent Document 1) describes a structure of a MOSFET made of silicon, the MOSFET including an element region and a termination region formed to surround the element region, a guard ring being formed at the termination region. According to the MOSFET described in Japanese Patent Laying-Open No. 2008-4643, a guard ring layer and an embedded guard ring layer are formed to have curvatures at a corner portion of the outermost base region such that they are concentric to each other. Moreover, in order to suppress the concentration of electric field at the corner portion of the outermost base region, the outermost base region is configured to have a radius of curvature about twice to four times as large as the thickness of the drift layer.

CITATION LIST

Patent Document

PTD 1: Japanese Patent Laying-Open No. 2008-4643

SUMMARY OF INVENTION

Technical Problem

However, if a MOSFET employing silicon carbide having a band gap larger than that of silicon is manufactured such that the radius of curvature of the outermost base region (in other words, the radius of curvature of the guard ring formed in contact with an end portion of the outermost base region) is about twice to four times as large as the thickness of the drift layer, an electric field is concentrated at the corner portion of the guard ring, with the result that the MOSFET may be broken.

Meanwhile, in order to relax the concentration of electric field at the corner portion of the guard ring, it is considered to increase the radius of curvature of the corner portion of the guard ring. However, a larger radius of curvature leads to a smaller area of the element region, resulting in a decreased on-state current.

In view of this, the present invention has an object to provide a silicon carbide semiconductor device capable of improving breakdown voltage while suppressing decrease of on-state current.

Solution to Problem

While silicon has a cubic crystal structure, silicon carbide can have a hexagonal crystal structure. The silicon having the cubic crystal structure does not have anisotropy in electric field strength, but the silicon carbide having the hexagonal crystal structure has anisotropy in electric field strength. Specifically, the electric field strength of the silicon carbide, having the hexagonal crystal structure, in a direction parallel to the c axis is about 1.6 times as large as the electric field strength thereof in a direction perpendicular to the c axis. Hence, a ratio of the radius of curvature of the guard ring and the thickness of the drift layer in silicon is simply inapplicable to silicon carbide. As a result of diligent study, the inventors have arrived at the present invention by finding that the breakdown voltage can be improved while suppressing decrease of the on-state current of the silicon carbide semiconductor device by configuring such that a value obtained by dividing a radius of curvature of an inner circumference portion of a curvature region by a thickness of a drift region is set to be not less than 5 and not more than 10.

A silicon carbide semiconductor device according to the present invention includes an element region and a guard ring region. In the element region, a semiconductor element is provided. The guard ring region has a first conductivity type and surrounds the element region in a plan view. The semiconductor element includes a drift region having a second conductivity type different from the first conductivity type. The guard ring region includes a linear region and a curvature region continuously connected to the linear region. A value obtained by dividing a radius of curvature of an inner circumference portion of the curvature region by a thickness of the drift region is not less than 5 and not more than 10.

In accordance with the silicon carbide semiconductor device according to the present invention, the value obtained by dividing the radius of curvature of the inner circumference portion of the curvature region by the thickness of the drift region is not less than 5 and not more than 10. Accordingly, the breakdown voltage can be improved while suppressing the decrease of the on-state current.

Preferably in the silicon carbide semiconductor device described above, the semiconductor element includes a body region in contact with the drift region and having the second conductivity type. A thickness of the body region is larger than a thickness of the guard ring region. Accordingly, electric field concentration can be suppressed efficiently at the corner portion of the body region.

Preferably in the silicon carbide semiconductor device described above, the guard ring region includes a JTE region in contact with the body region and having the second conductivity type. Accordingly, the breakdown voltage can be improved by the JTE region making contact with body region 13.

Preferably in the silicon carbide semiconductor device described above, the semiconductor element includes a source region in contact with the body region and having the first conductivity type, and a source electrode in contact with the source region. The JTE region is in contact with the source electrode. Accordingly, the source region can draw electrons from the JTE region at a high speed, whereby a depletion layer can be formed also in a high-frequency operation.

Preferably in the silicon carbide semiconductor device described above, the guard ring region includes a guard ring not in contact with the element region. Accordingly, the breakdown voltage can be improved by the guard ring that does not make contact with the element region.

Preferably in the silicon carbide semiconductor device described above, a plurality of the guard rings are provided. A value obtained by dividing a radius of curvature of an inner circumference portion of a curvature region of an innermost guard ring of the plurality of the guard rings by the thickness of the drift region is not less than 5 and not more than 10. In the case where there are the plurality of the guard rings, the radius of curvature of the innermost guard ring becomes smaller than the radii of curvatures of the other guard rings. Because the value obtained by dividing the radius of curvature of the inner circumference portion of the curvature region of the innermost guard ring by the thickness of the drift region is not less than 5 and not more than 10, the breakdown voltage can be improved while suppressing decrease of on-state current.

Preferably, the silicon carbide semiconductor device described above further includes a field stop region having the first conductivity type and surrounding the guard ring region in a plan view. Accordingly, the breakdown voltage of the silicon carbide semiconductor device can be improved further.

Preferably in the silicon carbide semiconductor device described above, a distance between an outer circumference portion of the guard ring region and an inner circumference portion of the field stop region is constant at any position of the outer circumference portion of the guard ring region in a plan view. Accordingly, an electric field can be suppressed from being concentrated locally.

Advantageous Effects of Invention

As apparent from the description above, according to the present invention, there can be provided a silicon carbide semiconductor device capable of improving breakdown voltage while suppressing decrease of on-state current.

DESCRIPTION OF EMBODIMENTS

Figure 1:
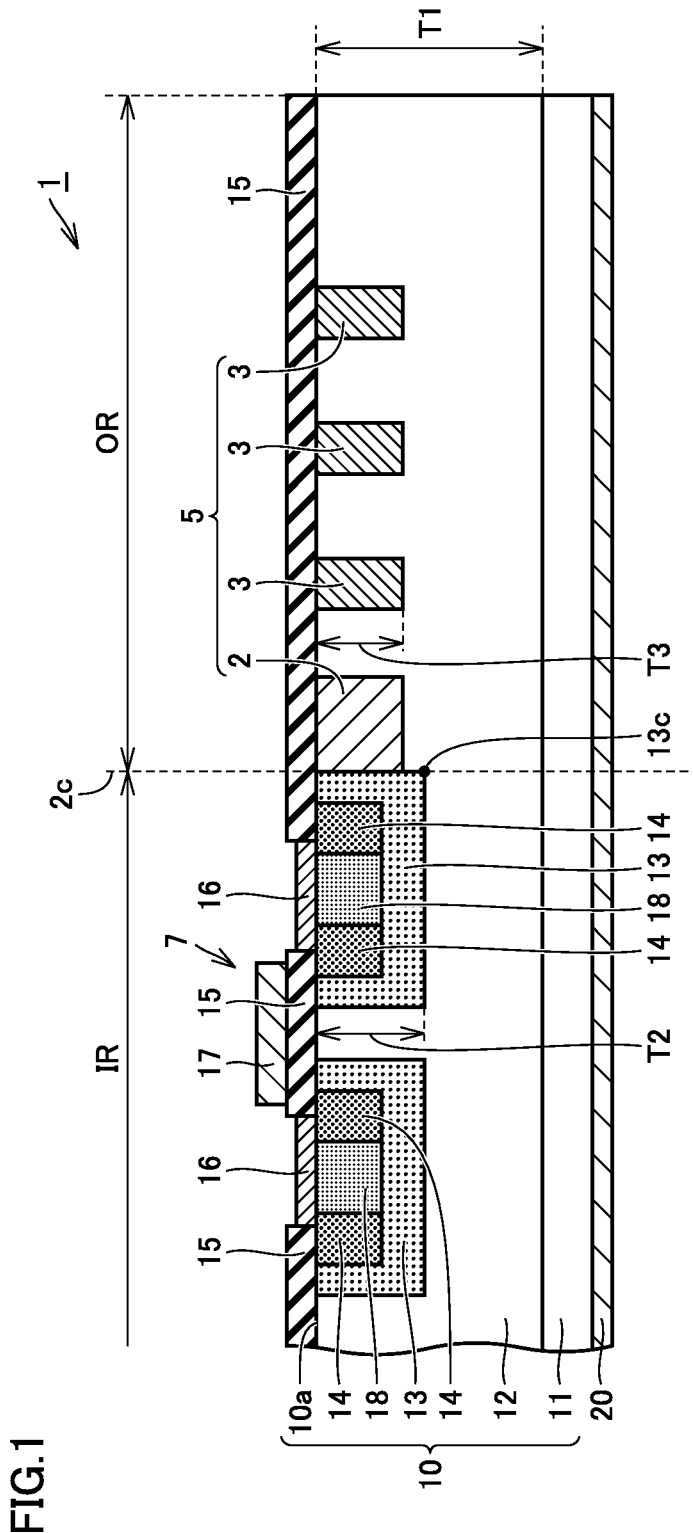
FIG. 1 is a schematic cross sectional view showing a configuration of a silicon carbide semiconductor device in an embodiment of the present invention.

The following describes embodiments of the present invention with reference to figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative index is supposed to be crystallographically indicated by putting "—" (bar) above a numeral, but is indicated by putting the negative sign before the numeral in the present specification. For description of an angle, a system in which an omnidirectional angle is 360° is employed.

First, the following describes a configuration of a MOSFET as a silicon carbide semiconductor device in an embodiment of the present invention.

Figure 2:
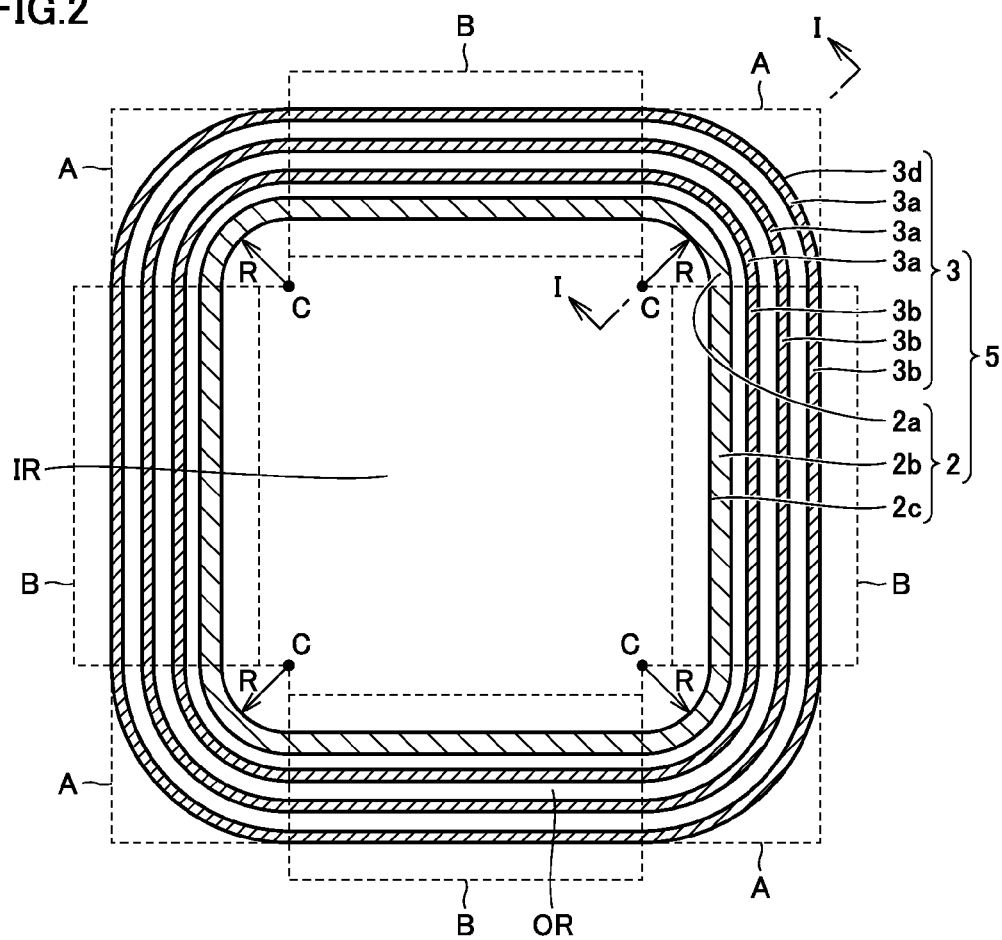
FIG. 2 is a schematic plan view showing the configuration of the silicon carbide semiconductor device in the embodiment of the present invention.

Referring to FIGS. 1 and 2, MOSFET 1 has an element region IR (activation region) and a termination region OR (invalid region) surrounding element region IR. Terminal region OR includes a guard ring region 5. In other words, element region IR is surrounded by guard ring region 5. In element region IR, a semiconductor element 7, such as a transistor or a diode, is provided.

Semiconductor element 7 mainly includes a silicon carbide substrate 10 made of hexagonal silicon carbide, a gate insulating film 15, a gate electrode 17, a source electrode 16, and a drain electrode 20, for example. Silicon carbide substrate 10 mainly includes an n+ substrate 11, a drift region 12, a p body region 13, an n+ source region 14, and a p+ region 18. Silicon carbide substrate 10 is made of hexagonal silicon carbide, for example. Silicon carbide substrate 10 may have a main surface 10a corresponding to a plane off by about not more than 8° relative to a {0001} plane, for example.

N+ substrate 11 is a substrate made of hexagonal silicon carbide and having n type conductivity (first conductivity type).

N+ substrate 11 includes an n type impurity such as N (nitrogen) at a high concentration. The concentration of the impurity such as nitrogen in n+ substrate 11 is, for example, about $1.0 \times 10^{18}$ cm$^{-3}$.

Drift region 12 is an epitaxial layer made of silicon carbide and having n type conductivity. Drift region 12 has a thickness T1 of about 15 μm, for example. Preferably, thickness T1 of drift region 12 is not less than 14.5 μm and not more than 15.5 μm. The n type impurity in drift region 12 is, for example, nitrogen, and is included therein at an impurity concentration lower than that of the n type impurity in n+ substrate 11. The concentration of the impurity, such as nitrogen, in drift region 12 is about $7.5 \times 10^{15}$ cm$^{-2}$, for example.

P body region 13 has p type conductivity. P body region 13 is formed in drift region 12 to include main surface 10a of silicon carbide substrate 10. P body region 13 includes a p type impurity, such as Al (aluminum) or B (boron). The concentration of the impurity, such as aluminum, in p body region 13 is about $1 \times 10^{17}$ cm$^{-2}$, for example.

N+ source region 14 has n type conductivity. N+ source region 14 includes main surface 10a, and is formed in p body region 13 such that it is surrounded by p body region 13. N+ source region 14 includes an n type impurity, such as P (phosphorus), at a concentration higher than that of the n type impurity in drift region 12, for example, at a concentration of about $1\times10^{20}$ cm$^{-2}$.

P+ region 18 has p type conductivity. P+ region 18 is formed in contact with main surface 10a and p body region 13 so as to extend through the vicinity of the center of n+ source region 14. P+ region 18 includes a p type impurity, such as aluminum or boron, at a concentration higher than that of the p type impurity in p body region 13, for example, at a concentration of about $1\times10^{20}$ cm$^{-2}$.

Gate insulating film 15 is formed in contact with drift region 12 to extend from above the upper surface of one n+ source region 14 to above the upper surface of the other n+ source region 14. Gate insulating film 15 is made of silicon dioxide, for example.

Gate electrode 17 is disposed on and in contact with gate insulating film 15 so as to extend from above one n+ source region 14 to above the other n+ source region 14. Gate electrode 17 is made of a conductor such as polysilicon or aluminum, for example.

On main surface 10a, source electrode 16 is disposed in contact with n+ source region 14 and p+ region 18. Moreover, source electrode 16 includes titanium (Ti) atoms, aluminum (Al) atoms, and silicon (Si), for example. Source electrode 16, which is thus an ohmic contact electrode containing Ti, Al, and Si, has a low contact resistance with respect to both the p type silicon carbide region and the n type silicon carbide region.

Drain electrode 20 is formed in contact with the main surface of n+ substrate 11 opposite to the main surface at which drift region 12 is formed. This drain electrode 20 may have the same configuration as that of source electrode 16 or may be made of a different material, such as Ni, allowing for ohmic contact with n+ substrate 11, for example. Accordingly, drain electrode 20 is electrically connected to n+ substrate 11.

Guard ring region 5 has an annular shape, and is disposed in termination region OR of silicon carbide substrate 10 so as to surround element region IR in which semiconductor element 7 is provided. Guard ring region 5 has p type conductivity (second conductivity type). Guard ring region 5 is an electrically conductive region serving as a guard ring. Guard ring region 5 includes: a JTE region 2 in contact with p body region 13; and a plurality of guard rings 3 not in contact with p body region 13, for example. Preferably, p body region 13 of semiconductor element 7 has a thickness T1 larger than a thickness T2 of guard ring region 5.

The plurality of guard rings 3 of guard ring region 5 include an impurity such as boron or aluminum. The impurity concentration in each of the plurality of guard rings 3 is lower than the impurity concentration of p body region 13. The impurity concentration in each of the plurality of guard rings 3 is, for example, $1.3\times10^{13}$ cm$^{-2}$, and is preferably about not less than $8\times10^{12}$ cm$^{-2}$ and not more than $1.4\times10^{13}$ cm$^{-2}$.

As shown in FIG. 2, guard ring region 5 has linear regions B and curvature regions A continuously connected to linear regions B. Specifically, linear regions B and curvature regions A are disposed alternately to form annular guard ring region 5 that surrounds element region IR. Curvature region A has an inner circumference portion 2c formed along the arc of a circle having a center C. Curvature region A of guard ring region 5 has a radius of curvature R. Radius of curvature R is not less than 50 μm and not more than 1260 μm, for example.

A value obtained by dividing radius of curvature R of inner circumference portion 2c of guard ring region 5 by thickness T1 of drift region 12 of semiconductor element 7 is not less than 5 and not more than 10. For example, thickness T1 of drift region 12 is 15 μm and the radius of curvature of inner circumference portion 2c of guard ring region 5 is 125 μm. In the above case, the value obtained by dividing radius of curvature R of inner circumference portion 2c of guard ring region 5 by thickness T1 of drift region 12 of semiconductor element 7 is about 8.3. When guard ring region 5 includes a plurality of guard rings 3, inner circumference portion 2c of guard ring region 5 refers to inner circumference portion 2c of guard ring 3 disposed closest to semiconductor element 7 (in other words, the innermost guard ring 3).

When guard ring region 5 includes a plurality of guard rings 3, the plurality of guard rings 3 are disposed with a gap interposed therebetween. Specifically, each of the plurality of guard rings 3 has linear regions B and curvature regions A. Linear regions B of the plurality of guard rings 3 are disposed in parallel with each other in a plan view. Meanwhile, curvature regions A of the plurality of guard rings 3 are disposed along the arcs of concentric circles having center C and having different radii. The respective concentrations of the p type impurities in the plurality of guard rings 3 may be the same or may be different from one another. Of the plurality of guard rings 3, a guard ring 3 at the outer circumference side preferably has an impurity concentration lower than the impurity concentration of a guard ring 3 at the inner circumference side.

Guard ring region 5 may have JTE (Junction Termination Extension) region 2 making contact with p body region 13 of semiconductor element 7 and having p type conductivity, for example. JTE region 2 may have the same impurity as the impurity of guard ring 3 at the same impurity concentration as the impurity concentration of guard ring 3. The impurity concentration of JTE region 2 is lower than the impurity concentration of p body region 13. Preferably, thickness Ti of p body region 13 of semiconductor element 7 is larger than thickness T2 of JTE region 2. It should be noted that when guard ring region 5 includes JTE region 2 and guard rings 3, guard ring region 5 refers to a region between inner circumference portion 2c of JTE region 2 and outer circumference portion 3d of the outermost guard ring 3 in a plan view.

Figure 3:
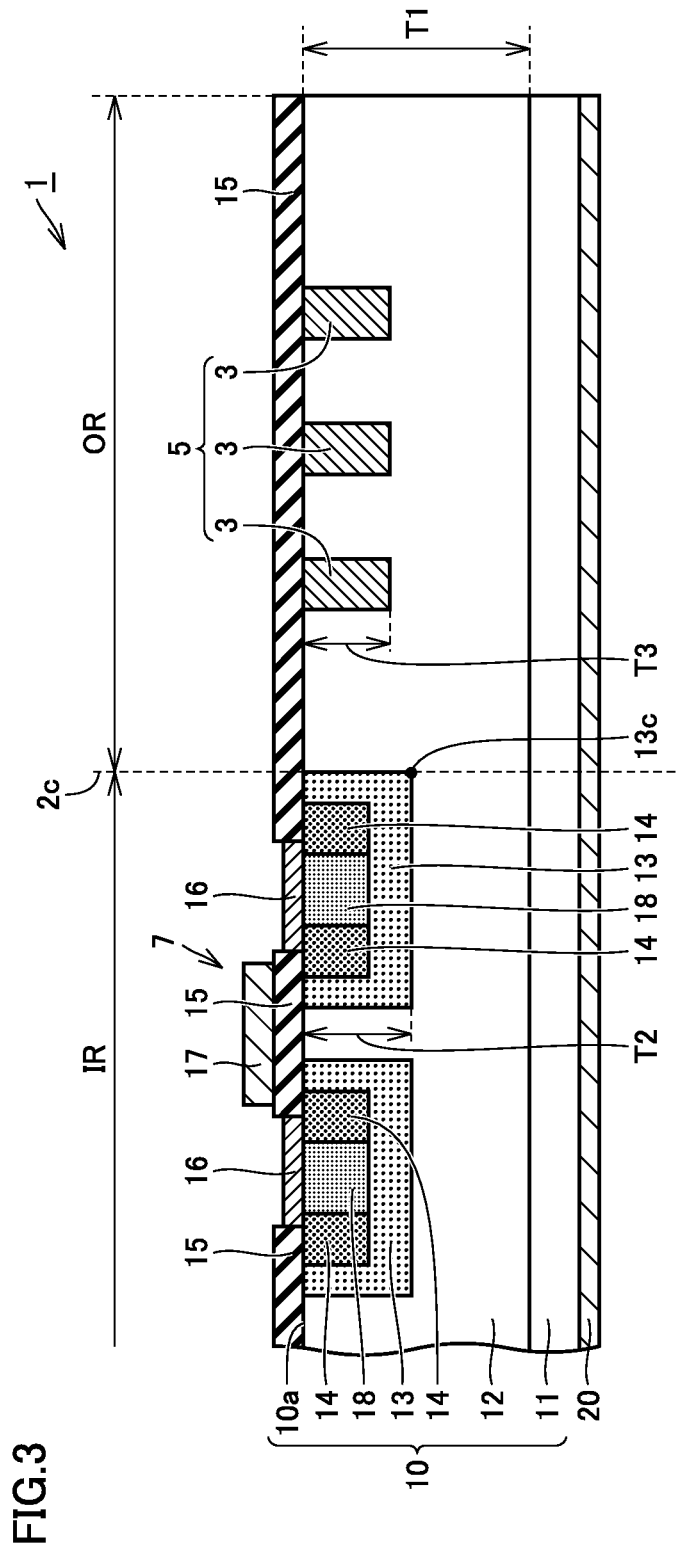
FIG. 3 is a schematic cross sectional view showing a configuration of a first modification of the silicon carbide semiconductor device in the embodiment of the present invention.

Referring to FIG. 3, guard ring region 5 of MOSFET 1 may not have JTE region 2 in contact with p body region 13 and may have guard ring 3 not in contact with p body region 13. The impurity and impurity concentration of guard ring 3 are the same as those of the foregoing guard ring 3. One guard ring 3 may be provided or a plurality of guard rings 3 may be provided. Preferably, a plurality of guard rings 3 are disposed with a gap being interposed therebetween.

Figure 4:
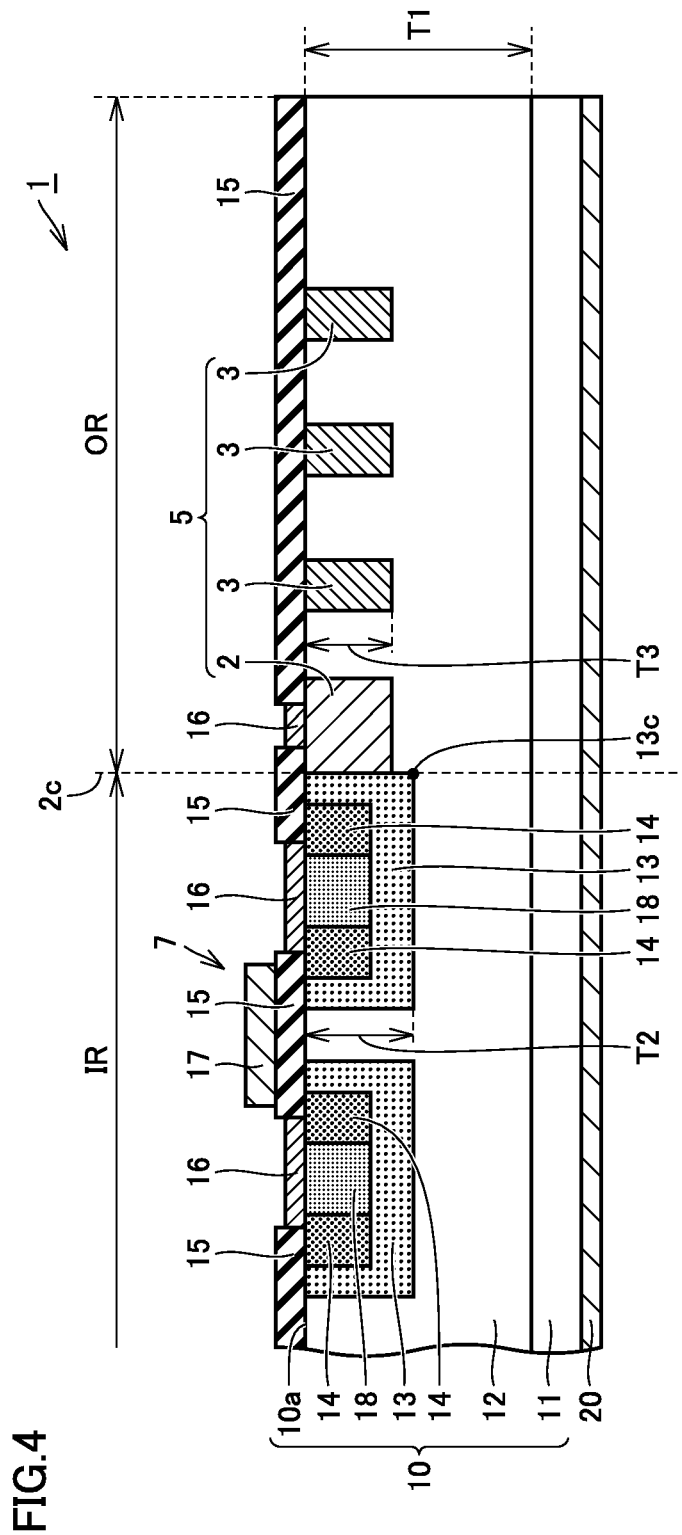
FIG. 4 is a schematic cross sectional view showing a configuration of a second modification of the silicon carbide semiconductor device in the embodiment of the present invention.

Referring to FIG. 4, MOSFET 1 may have JTE region 2 in contact with p body region 13, and source electrode 16a may be formed in contact with JTE region 2. Source electrode 16a is electrically connected to source electrode 16 formed in contact with source region 14 surrounded by p body region 13 and p+ region 18 surrounded by source region 14.

Figure 5:
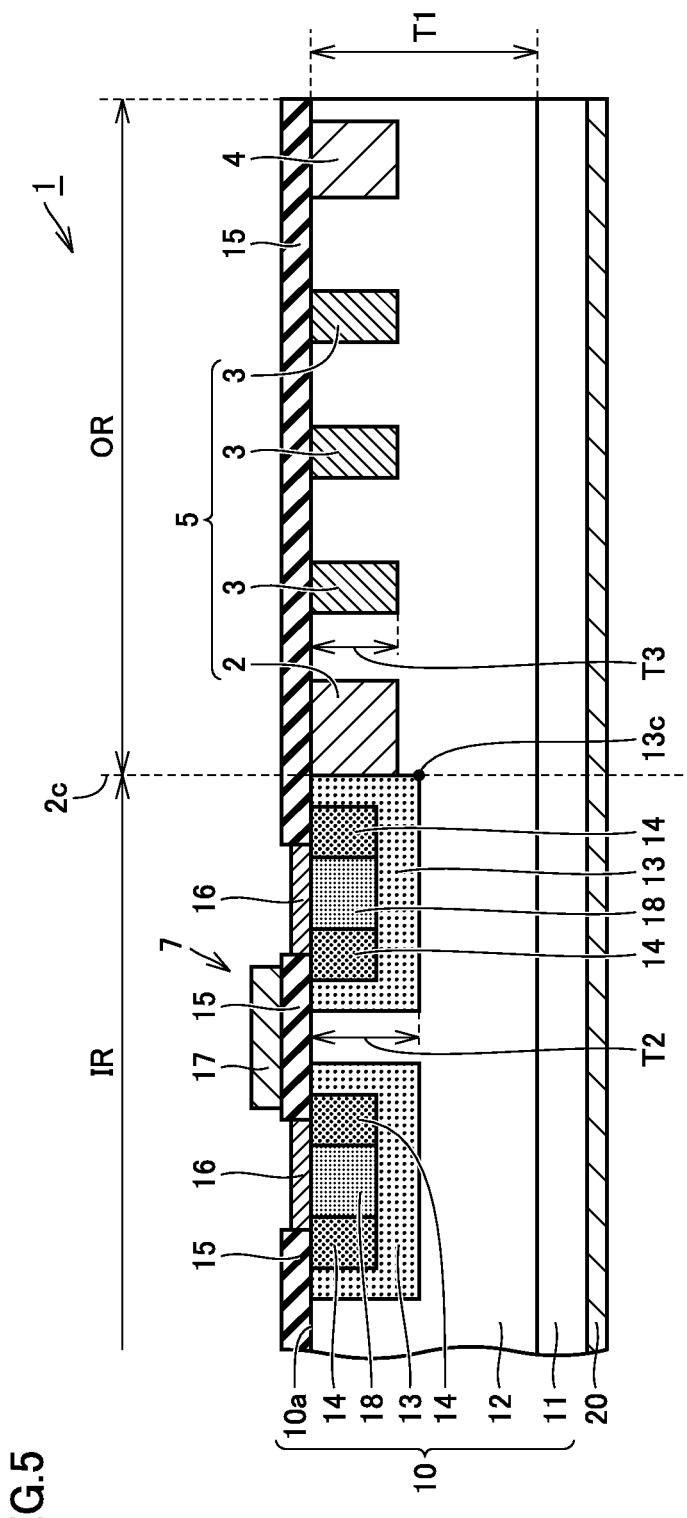
FIG. 5 is a schematic cross sectional view showing a configuration of a third modification of the silicon carbide semiconductor device in the embodiment of the present invention.
Figure 6:
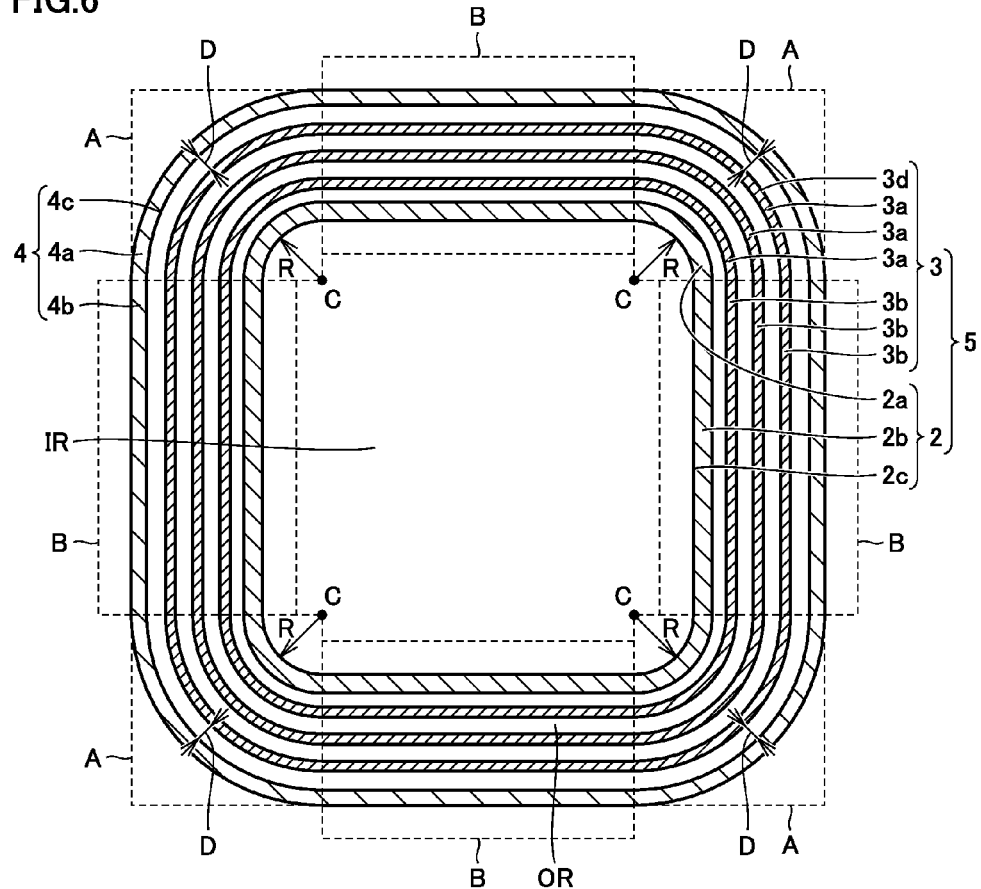
FIG. 6 is a schematic plan view showing the configuration of the third modification of the silicon carbide semiconductor device in the embodiment of the present invention.

Referring to FIG. 5 and FIG. 6, MOSFET 1 may further include a field stop region 4 having n type conductivity so as to surround guard ring region 5 having p type conductivity. Field stop region 4 has the same conductivity type (n type) as that of drift region 12. Field stop region 4 has an impurity concentration higher than the impurity concentration of drift region 12. The concentration of the impurity in field stop region 4 is about $1.0\times10^{18}$ cm$^{-3}$, for example. Preferably, a shortest distance D between outer circumference portion 3d of guard ring region 5 and inner circumference portion 4c of field stop region 4 is constant at any position of outer circumference portion 3d of guard ring region 5. When guard ring region 5 has a plurality of guard rings 3, shortest distance D refers to the shortest distance between outer circumference portion 3d of the outermost guard ring 3 and inner circumference portion 4c of field stop region 4.

The following describes an operation of MOSFET 1. When gate electrode 17 is fed with a voltage not more than a threshold value, i.e., during the OFF state, p body region 13 and drift region 12 just below gate insulating film 15 are reverse-biased, with the result that MOSFET 1 is brought into the non-conductive state. On the other hand, when gate electrode 17 is fed with a positive voltage, an inversion layer is formed in a channel region near a location at which p body region 13 makes contact with gate insulating film 15. As a result, n+ source region 14 and drift region 12 are electrically connected to each other, whereby a current flows between source electrode 22 and drain electrode 20.

The following describes a method for manufacturing MOSFET 1 according to the embodiment of the present invention.

Figure 7:
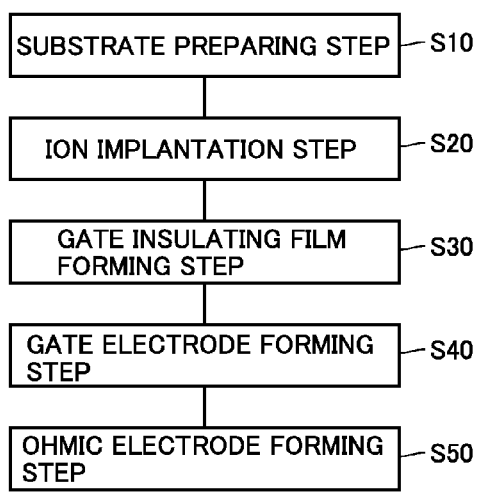
FIG. 7 is a flowchart schematically showing a method for manufacturing the silicon carbide semiconductor device in the embodiment of the present invention.
Figure 8:
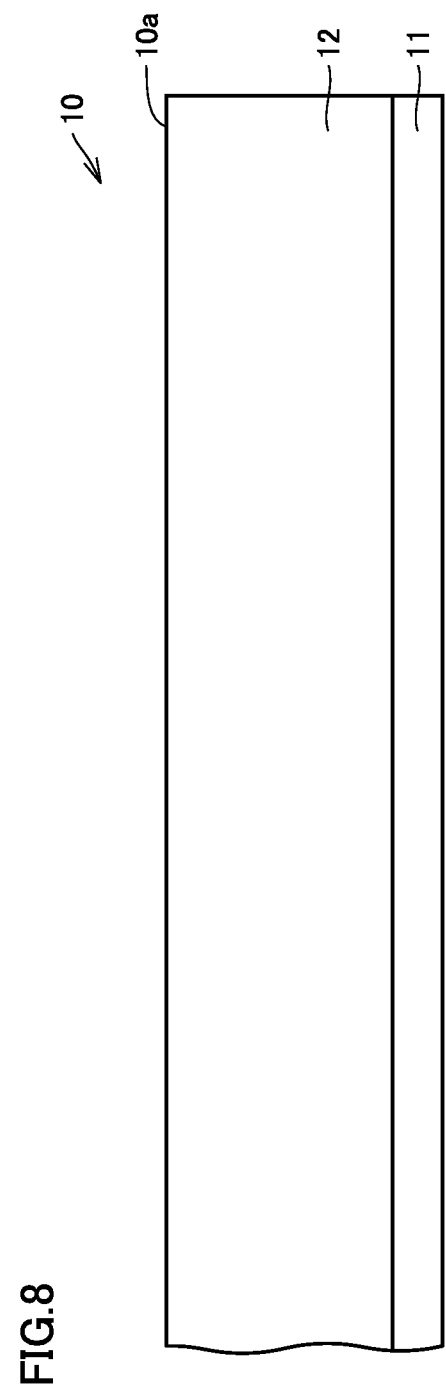
FIG. 8 is a schematic cross sectional view showing a first step of the method for manufacturing the silicon carbide semiconductor device in the embodiment of the present invention.

Referring to FIG. 8, silicon carbide substrate 10 is first prepared in a substrate preparing step (S10: FIG. 7). Specifically, drift region 12 is formed by epitaxial growth on one main surface of n+ substrate 11 made of hexagonal silicon carbide. The epitaxial growth can be performed using, as a source material gas, a mixed gas of $SiH_4$ (silane) and $C_3H_8$ (propane), for example. On this occasion, N (nitrogen) is introduced as an n type impurity, for example. In this way, drift region 12 is formed which includes the n type impurity at a concentration lower than that of the n type impurity in n+ substrate 11.

Next, an oxide film made of silicon dioxide is formed on main surface 10a of silicon carbide substrate 10 by means of CVD (Chemical Vapor Deposition), for example. Then, a resist is applied onto the oxide film and then exposure and development are performed, thereby forming a resist film having an opening at a region in conformity with the shape of desired p body region 13. Then, the oxide film is partially removed by means of RIE (Reactive Ion Etching) using the resist film as a mask, for example, thereby forming a mask layer constructed of the oxide film with an opening pattern on drift region 12.

Figure 9:
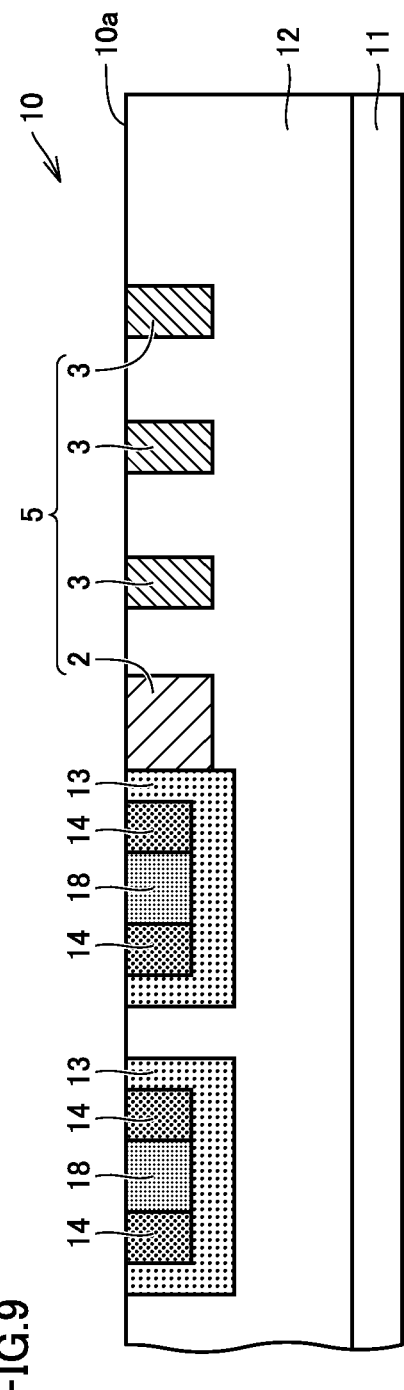
FIG. 9 is a schematic cross sectional view showing a second step of the method for manufacturing the silicon carbide semiconductor device in the embodiment of the present invention.

Referring to FIG. 9, an ion implantation step (S20: FIG. 7) is performed. In the ion implantation step, ions are implanted into silicon carbide substrate 10, thereby forming p body region 13, n+ source region 14, and guard ring region 5. Specifically, after removing the resist film described above, ions of the p type impurity such as Al are implanted into drift region 12 using the mask layer as a mask, thereby forming p body region 13 and guard ring region 5. Moreover, after removing the oxide film used as the mask, a mask layer is formed which has an opening at a region in conformity with the shape of desired n+ source region 14.

Next, the mask layer is used as a mask to introduce an n type impurity, such as P (phosphorus), into drift region 12 through ion implantation, thereby forming n+ source region 14. Next, a mask layer having an opening at a region in conformity with the shape of desired p+ region 18 is formed, and this mask layer is used as a mask to introduce a p type impurity, such as Al or B, into drift region 12 through ion implantation, thereby forming p+ region 18. It should be noted that p body region 13 of semiconductor element 7 may be formed before/after the formation of guard ring region 5. The formation of guard ring region 5 specifically refers to the formation of JTE region 2 and guard ring 3. It should be noted that the implantation depth of p body region 13 is preferably larger than the implantation depth of guard ring region 5. Moreover, field stop region 4 may be formed to surround guard ring region 5 in a plan view.

Next, a heat treatment is performed to activate the impurities introduced by the ion implantations described above. Specifically, for example, silicon carbide substrate 10 having the ions implanted therein is heated at about 1700° C. in an Ar (argon) atmosphere and is held for about 30 minutes.

Figure 10:
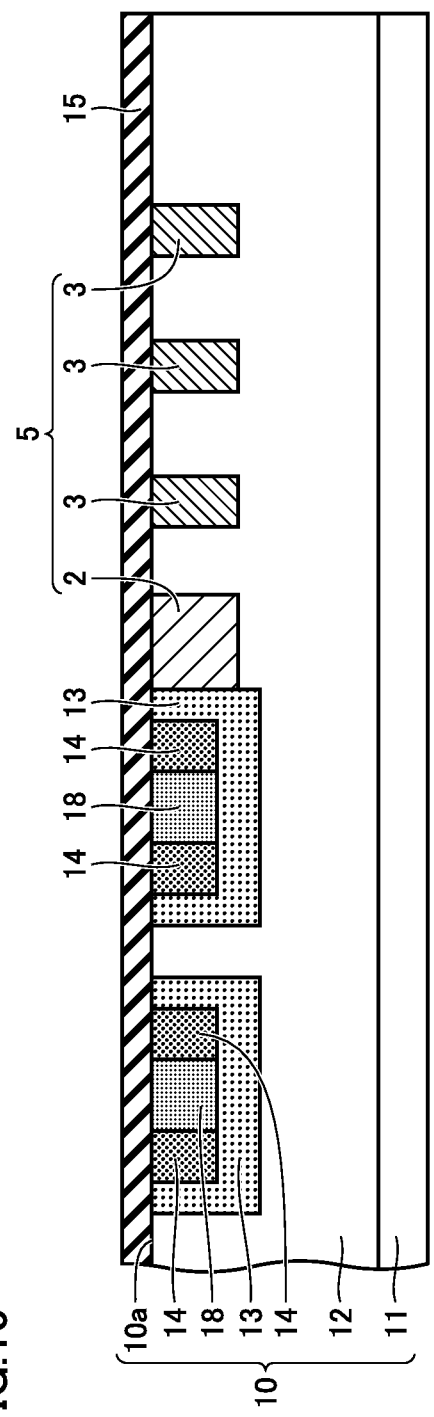
FIG. 10 is a schematic cross sectional view showing a third step of the method for manufacturing the silicon carbide semiconductor device in the embodiment of the present invention.

Referring to FIG. 10, a gate insulating film forming step (step S30: FIG. 7) is performed. Specifically, first, silicon carbide substrate 10 is thermally oxidized in which the desired ion implantation regions are formed by the above-described step (S20: FIG. 7). The thermal oxidation can be performed by heating at about 1300° C. in an oxygen atmosphere for about 40 minutes, for example. Accordingly, gate insulating film 15 made of silicon dioxide is formed on main surface 10a of silicon carbide substrate 10.

Next, a gate electrode forming step (S40: FIG. 7) is performed. In this step, gate electrode 17, which is made of a conductor such as polysilicon or aluminum, is formed in contact with gate insulating film 15 so as to extend from above one n+ source region 14 to above the other n+ source region 14. When polysilicon is employed as the material of gate electrode 17, the polysilicon can be configured to include phosphorus at a high concentration more than $1 \times 10^{20}$ cm$^{-3}$. Then, an insulating film made of, for example, silicon dioxide is formed to cover gate electrode 17.

Next, an ohmic electrode forming step (S50: FIG. 7) is performed. Specifically, for example, a resist pattern is formed to expose p+ region 18 and a portion of n+ source region 14, and a metal film including, for example, Si atoms, Ti atoms, and Al atoms is formed entirely on the surface of the substrate by means of, for example, sputtering. Then, by, for example, lifting off the resist pattern, metal film 50 is formed in contact with gate insulating film 15 and in contact with p+ region 18 and n+ source region 14. Then, for example, by heating the metal film at about 1000° C., source electrode 16 is formed in ohmic contact with silicon carbide substrate 10. Moreover, drain electrode 20 is formed in contact with n+ substrate 11 of silicon carbide substrate 10. MOSFET 1 shown in FIG. 1 is completed.

It should be noted that a configuration may be employed in which n type conductivity and p type conductivity in the embodiment are replaced with each other. Moreover, in the present embodiment, the planar type MOSFET has been described as an example of the silicon carbide semiconductor device, the silicon carbide semiconductor device may be a trench type MOSFET. Furthermore, the silicon carbide semiconductor device may be an IGBT (Insulated Gate Bipolar Transistor) or the like.

Next, the following describes function and effect of the method for manufacturing MOSFET 1 according to the present embodiment.

In accordance with MOSFET 1 according to the present embodiment, the value obtained by dividing radius of curvature R of inner circumference portion 2c of curvature region A of guard ring region 5 by the thickness of drift region 12 is not less than 5 and not more than 10. Because the value obtained by dividing radius of curvature R of inner circumference portion 2c of curvature region A of guard ring region 5 by the thickness of drift region 12 is not less than 5 and not more than 10, the breakdown voltage can be improved while suppressing decrease of the on-state current.

Further, in accordance with MOSFET 1 according to the present embodiment, semiconductor element 7 includes a body region 13 in contact with drift region 12 and having the second conductivity type. A thickness T2 of body region 13 is larger than a thickness T3 of guard ring region 5. Accordingly, electric field concentration can be suppressed efficiently at corner portion 13c of body region 13.

Further, in accordance with MOSFET 1 according to the present embodiment, guard ring region 5 includes a JTE region 2 in contact with body region 13 and having the second conductivity type. Accordingly, the breakdown voltage can be improved by JTE region 2 making contact with body region 13.

Further, in accordance with MOSFET 1 according to the present embodiment, semiconductor element 7 includes a source region 14 in contact with body region 13 and having the first conductivity type, and a source electrode 16 in contact with source region 14. JTE region 2 is in contact with source electrode 16. Accordingly, source region 14 can draw electrons from JTE region 2 at a high speed, whereby a depletion layer can be formed also in a high-frequency operation.

Further, in accordance with MOSFET 1 according to the present embodiment, guard ring region 5 includes a guard ring 3 not in contact with element region IR. Accordingly, the breakdown voltage can be improved by guard ring 3 that does not make contact with element region IR.

Further, in accordance with MOSFET 1 according to the present embodiment, a plurality of guard rings 3 are provided. A value obtained by dividing a radius of curvature R of an inner circumference portion 2c of a curvature region A of an innermost guard ring 3 of the plurality of guard rings 3 by thickness T1 of drift region 12 is not less than 5 and not more than 10. In the case where there are the plurality of guard rings 3, radius of curvature R of the innermost guard ring 3 becomes smaller than radii of curvatures R of the other guard rings 3. Because the value obtained by dividing radius of curvature R of the inner circumference portion of curvature region A of the innermost guard ring 3 by thickness T1 of drift region 12 is not less than 5 and not more than 10, the breakdown voltage can be improved while suppressing decrease of on-state current.

MOSFET 1 according to the present embodiment further includes a field stop region 4 having the first conductivity type and surrounding guard ring region 5 in a plan view. Accordingly, the breakdown voltage of the silicon carbide semiconductor device can be improved further.

Further, in accordance with MOSFET 1 according to the present embodiment, a distance d between an outer circumference portion 3d of guard ring region 5 and an inner circumference portion 4c of field stop region 4 is constant at any position of outer circumference portion 3d of guard ring region 5 in a plan view. Accordingly, an electric field can be suppressed from being concentrated locally.

Example

In the present example, a relation between the on-state current and the breakdown voltage was examined by changing the value obtained by dividing radius of curvature R of the inner circumference portion of guard ring 3 by thickness T1 of drift region 12 (hereinafter, referred to as "drift layer ratio"). First, three types of MOSFETs 1 each made of silicon carbide and including drift region 12 having thickness T1 of 15 μm were prepared using the manufacturing method illustrated in the embodiment. The n type impurity concentration of drift region 12 was set at $7.5\times10^{15}$ cm$^{-2}$. The chip of MOSFET 1 was a square having each side of 3 mm.

In MOSFET 1, guard ring region 5 was provided to surround element region IR. The impurity concentration of guard ring region 5 was set at $1.3\times10^{13}$ cm$^{-2}$. Radii of curvatures R of inner circumference portions 2c of curvature regions A of guard ring regions 5 of MOSFETs 1 were set at 50 μm, 125 μm, and 1260 μm, respectively. That is, three types of MOSFETs 1 were prepared in which the drift layer ratios were 3.3, 8.3, and 84.3. For each of MOSFETs 1, the on-state current and the breakdown voltage were measured. It should be noted that the shape of element region IR of the MOSFET having a drift ratio of 84.3 is circular in a plan view.

The breakdown voltage was measured by applying reverse voltage to each of the MOSFETs and measuring a reverse current. The breakdown voltage was defined as a voltage such that the reverse current becomes large rapidly when the reverse voltage is increased. A resulting broken portion was specified using an emission microscope. For example, when MOSFET 1 having a drift layer ratio of 3.3 was observed using an emission microscope and the reverse voltage was 1200 V, strong light emission was observed at curvature region A of guard ring region 5. That is, it was confirmed that breakage took place at curvature region A of guard ring region 5.

Figure 11:
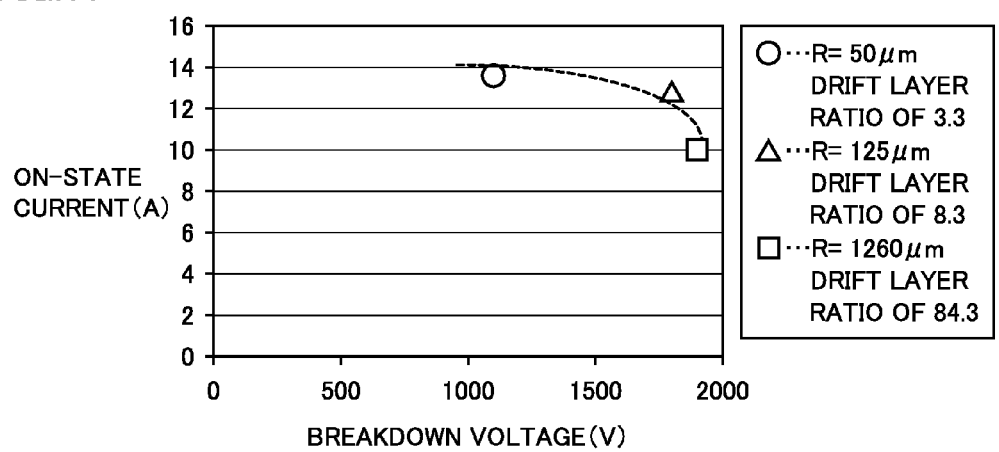
FIG. 11 shows a relation between on-state current and a breakdown voltage.

Referring to FIG. 11, the following describes a relation between the on-state current of MOSFET 1 and the breakdown voltage. When radius of curvature R of curvature region A of guard ring region 5 becomes small, an electric field is likely to be concentrated on curvature region A, with the result that the breakdown voltage is decreased. A targeted specification for the breakdown voltage in MOSFET 1 is, for example, 1200 V. When the drift layer ratio is 3.3, the on-state current exhibits a high value of 13.6 A but the breakdown voltage is about 1100 V, which does not satisfy the specification. A drift layer ratio allowing for a breakdown voltage of not less than 1200 V is considered to be 5 or more.

On the other hand, when radius of curvature R of curvature region A of guard ring region 5 becomes large, the electric field concentration is eased, with the result that the breakdown voltage is increased. However, when the area of curvature region A is increased, the area of element region IR is decreased, with the result that the on-state current flowing in semiconductor element 7 becomes small. MOSFET 1 desirably has a high breakdown voltage and a high on-state current (i.e., has characteristics indicated at the upper right side in FIG. 11). A targeted specification for the on-state current in MOSFET 1 is, for example, 12 A. When the drift layer ratio is 8.3, the breakdown voltage is 1800 V and the on-state current is 12.8 A. When the drift layer ratio is 84.3, the breakdown voltage is high, i.e., 1900 V but the on-state current is about 10 A, which does not satisfy the specification. When the drift layer ratio exceeds 8.3, the breakdown voltage is not increased so much but the on-state current is decreased rapidly. A drift layer ratio allowing for the on-state current of not less than 12 A is considered to be 10 or less. Hence, it is considered that a drift layer ratio achieving both the specifications for the on-state current and the breakdown voltage is not less than 5 and not more than 10.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: MOSFET; 2: JTE region; 2a: curvature region; 2b: linear region; 2c: inner circumference portion; 3: guard ring; 3a: curvature region; 3b: linear region; 5: guard ring region; 7: semiconductor element; 10: silicon carbide substrate; 10a: main surface; 11: n+ substrate; 12: drift region; 13: p body region; 14: n+ source region; 15: gate insulating film; 16: source electrode; 17: gate electrode;

18: p+ region; 20: drain electrode; A: curvature region; B: linear region; IR: element region; OR: termination region.

The invention claimed is:

1. A silicon carbide semiconductor device, comprising: an element region in which a semiconductor element is provided; and a guard ring region having a first conductivity type and surrounding said element region in a plan view,
   said semiconductor element including a drift region having a second conductivity type different from said first conductivity type,
   said guard ring region including a linear region and a curvature region continuously connected to said linear region,
   a value obtained by dividing a radius of curvature of an inner circumference portion of said curvature region by a thickness of said drift region being not less than 5 and not more than 10.

2. The silicon carbide semiconductor device according to claim 1, wherein
   said semiconductor element includes a body region in contact with said drift region and having said second conductivity type, and
   a thickness of said body region is larger than a thickness of said guard ring region.

3. The silicon carbide semiconductor device according to claim 2, wherein said guard ring region includes a JTE region in contact with said body region and having said second conductivity type.

4. The silicon carbide semiconductor device according to claim 3, wherein
   said semiconductor element includes a source region in contact with said body region and having said first conductivity type, and a source electrode in contact with said source region, and
   said JTE region is in contact with said source electrode.

5. The silicon carbide semiconductor device according to claim 1, wherein said guard ring region includes a guard ring not in contact with said element region.

6. The silicon carbide semiconductor device according to claim 5, wherein
   a plurality of said guard rings are provided, and
   a value obtained by dividing a radius of curvature of an inner circumference portion of a curvature region of an innermost guard ring of the plurality of said guard rings by said thickness of said drift region is not less than 5 and not more than 10.

7. The silicon carbide semiconductor device according to claim 1, further comprising a field stop region having said first conductivity type and surrounding said guard ring region in a plan view.

8. The silicon carbide semiconductor device according to claim 7, wherein a distance between an outer circumference portion of said guard ring region and an inner circumference portion of said field stop region is constant at any position of said outer circumference portion of said guard ring region in a plan view.

* * * * *